United States Patent [19]

Armacost et al.

[11] Patent Number: 5,767,017
[45] Date of Patent: Jun. 16, 1998

[54] SELECTIVE REMOVAL OF VERTICAL PORTIONS OF A FILM

[75] Inventors: Michael David Armacost, Wallkill, N.Y.; Steven Alfred Grundon, Underhill, Vt.; David Laurant Harmon, Essex, Vt.; Donald McAlpine Kenney, Shelburne, Vt.

[73] Assignee: International Business Machines Corporation, Armonk, N.Y.

[21] Appl. No.: 576,186

[22] Filed: Dec. 21, 1995

[51] Int. Cl.$^6$ ............................................ H01L 21/311
[52] U.S. Cl. .................. 438/694; 438/696; 438/388; 438/436; 156/644.1
[58] Field of Search .................. 156/644.1; 438/694, 438/696, 388, 436

[56] References Cited

U.S. PATENT DOCUMENTS

| | | | |
|---|---|---|---|
| 4,181,564 | 1/1980 | Fogarty et al. | 156/643 |
| 4,256,514 | 3/1981 | Pogge | 148/1.5 |
| 4,502,914 | 3/1985 | Trumpp et al. | 156/643 |
| 4,522,681 | 6/1985 | Gorowitz et al. | 156/643 |
| 4,613,400 | 9/1986 | Tam et al. | 156/643 |
| 4,732,871 | 3/1988 | Buchmann et al. | 437/41 |
| 4,801,554 | 1/1989 | Gobrecht et al. | 437/6 |
| 4,919,748 | 4/1990 | Bredbenner et al. | 156/643 |
| 4,957,590 | 9/1990 | Doublas | 156/643 |
| 5,068,169 | 11/1991 | Takechi et al. | 430/313 |
| 5,079,178 | 1/1992 | Chouan et al. | 437/40 |
| 5,211,790 | 5/1993 | Tatsumi | 156/662 |
| 5,217,570 | 6/1993 | Kadomura | 156/665 |
| 5,266,154 | 11/1993 | Tatsumi | 156/643 |
| 5,310,454 | 5/1994 | Ohiwa et al. | 156/643 |
| 5,360,510 | 11/1994 | Kadomura | 156/665 |
| 5,364,816 | 11/1994 | Boos et al. | 437/133 |
| 5,376,225 | 12/1994 | Wakabayashi et al. | 156/643 |
| 5,429,710 | 7/1995 | Akiba et al. | 216/17 |
| 5,453,156 | 9/1995 | Cher et al. | 156/643.1 |

OTHER PUBLICATIONS

Barklund et al., "Influence of Different Etching Mechanisms on the Angular Dependence of Silicon Nitride Etching", J. Vac. Sci.Technol. A, vol. 11, No. 4, Jul./Aug. 1993, pp. 1226–1229.

*Primary Examiner*—John Niebling
*Assistant Examiner*—Long Pham
*Attorney, Agent, or Firm*—Alison D. Mortinger

[57] ABSTRACT

A body is provided with a substantially horizontal surface and a substantially vertical surface. A film is formed on the body with a substantially horizontal portion on the substantially horizontal surface, a substantially vertical portion on the substantially vertical surface, and a corner region joining the substantially horizontal and substantially vertical portions. The corner region and the substantially vertical portion of the film are removed while the body and the substantially horizontal portion of the film are left substantially intact. A high density plasma with a fluorocarbon-based etching gas may be used to remove the vertical portion and corner region.

34 Claims, 6 Drawing Sheets

SELECTIVE REMOVAL OF VERTICAL PORTIONS OF A FILM

FIELD OF THE INVENTION

This invention is directed to a dry etching method applicable to the production of semiconductor devices, and more particularly to a method of selectively etching different portions of a film.

BACKGROUND OF THE INVENTION

Anisotropic (directional) dry etching is conventionally used to selectively remove horizontal portions of a film, while leaving substantially vertical portions of the film intact. For example, reactive ion etching (RIE) is used to create sidewalls on semiconductor structures such as gate stacks. (See U.S. Pat. No. 4,256,514 to Pogge).

Selective removal of substantially vertical portions of a film while leaving horizontal portions intact is a different issue altogether, and is desirable in order to create features with sub-micron lateral dimensions equal to the thickness of the vertical film portion. Existing techniques include masking of the horizontal portions followed by (1) isotropic (non-directional) wet dips which can undercut either portions of the film to be kept or adjacent structures; (2) isotropic dry film removal techniques such as parallel plate plasma processing and chemical downstream plasma reactions which can result in undercut problems as well; or (3) directional dry etch processes (RIE) which can result in incomplete removal of the vertical portion, which requires extensive overetch or a subsequent wet dip to remove. In the last technique, extensive overetch can cause excessive resist erosion, degradation of profile integrity, or erosion of the etch stop material.

The above processes all use masking to protect the horizontal portions of the film, and as such add extra process steps and thus introduce sources of process error. One method that does not use a mask is described in U.S. Pat. No. 4,801,554 to Gobrecht, et al. Gobrecht deposits a non-conformal film with thicker horizontal portions and thinner vertical portions, followed by non-selective etching to remove the vertical portion first and leave part of the horizontal region. However, controlling both the deposition and the etching to remove a vertical film portion of desired thickness is difficult, a "lobe" will tend to occur on the corner, and the non-selective etching is likely to remove some of the horizontal portion immediately adjacent to the vertical portion.

Thus, there remains a need to remove the substantially vertical portions of a film without significantly attacking nonmasked horizontal portions of the same film, and at the same time avoid attacking adjacent films or structures in a simplified, repeatable process.

SUMMARY OF THE INVENTION

It is therefore an object of the present invention to provide a means for selectively etching a substantially vertical portion of a film.

It is a further object to provide a means for selectively etching a substantially vertical portion of a film without attacking substantially horizontal portions of the same film.

It is another object to provide a means for making structures with sub-micron lateral dimensions equal to the thickness of the vertical portion of a film.

In accordance with the above listed and other objects, a method is described in which a body is provided with a substantially horizontal surface and a substantially vertical surface. A film is formed on the body with a substantially horizontal portion on the substantially horizontal surface, a substantially vertical portion on the substantially vertical surface, and a corner region joining the substantially horizontal and substantially vertical portions. The corner region and the substantially vertical portion of the film are removed while the body and the substantially horizontal portion of the film are left substantially intact. A high density plasma employing a fluorocarbon-based etching gas may be used to remove the vertical portion and corner region.

BRIEF DESCRIPTION OF THE DRAWINGS

These and other features, aspects, and advantages will be more readily apparent and better understood from the following detailed description of the invention, in which:

FIG. 3b is a schematic sectional representation of an SEM of the post-etch structure depicted in FIG. 3a;

DESCRIPTION OF THE PREFERRED EMBODIMENTS

Figure 1:
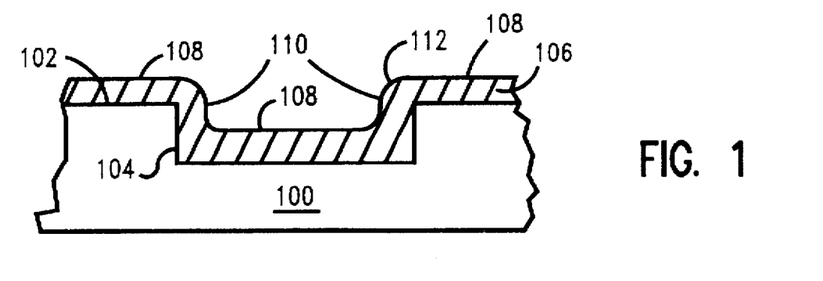
FIG. 1 is a schematic sectional view of a pre-etch structure.

Referring now to the drawings and more particularly to FIG. 1, a schematic sectional view of a pre-etch structure is shown. A body 100 having a substantially horizontal surface 102 and a substantially vertical surface 104 has a film 106 formed thereon. Film 106 may either be conformal or non-conformal in thickness. Film 106 has substantially horizontal portions 108 and substantially vertical portions 110 positioned over portions 102 and 104, respectively, of body 100.

Note that body 100 may be composed of, for example, a semiconductor substrate, and surfaces 102 and 104 may be part of a semiconductor device formed on the substrate. Note further that the substrate may contain one or several layers of circuitry formed therein.

Body 100 with film 106 are then processed using a conventional plasma process, and preferably a high density plasma process such as ECR plasma, helicon wave plasma, inductively coupled plasma (ICP), transformer coupled plasma (TCP), hollow anode type plasma, or helical resonator plasma. Generally, any plasma with a density higher than $10^{11}/cm^3$ is considered to be high density.

According to the present invention, a plasma of fluorocarbon-based etching gas, with the fluorocarbon described as $C_xF_y$ where both x and y are greater than zero, is used to selectively etch the vertical portion. An inert gas may be added such as Ar and/or other additives such as CO, $O_2$, $SiF_4$, $CH_3F$, and the like. Examples of fluorocarbon compounds that will work include the following: $CF_4$, $C_2F_6$, $C_3F_8$, $C_4F_8$, $C_3F_6$, $CHF_3$, etc.

Figure 2A:
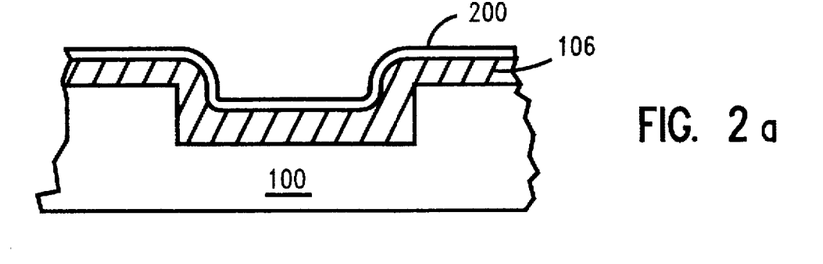
FIGS. 2a and 2b are schematic sectional views of the structure during the etching process.

In FIG. 2a, during the etch process, a carbonaceous polymer 200 forms on film 106, which generally slows down or prevents etching. Typically, the carbonaceous polymer 200 which forms on the curved corner regions 112 of film 106 etches and/or sputters at a faster rate than the horizontal surfaces.

Some research has suggested a dependence of etch rate on the angle of incidence of the incoming ions in reactive ion beam etching (RIBE). (See "Influence of different etching mechanisms on the angular dependence of silicon nitride etching" in J. Vac. Sci. Technol. A, Vol 11 No. 4, Jul/Aug 1993 by Barklund et al.) The angle at which the highest etch rate occurred was dependent upon the ambient pressure and etching gas used. In one specific case, a four-fold increase in etch rate of silicon nitride was observed at a 60 degree angle versus a 0 degree angle using $CH_3F/O_2$ as an etch gas. Other process conditions yielded maximum etch rates at varying angles, with one case having a maximum etch rate at 0 degrees. Barklund postulated that the angular dependence was in large extent due to formation of a polymer layer on the surface to be etched. For angles over 60 degrees, lesser polymer coverage was observed.

Figure 2B:
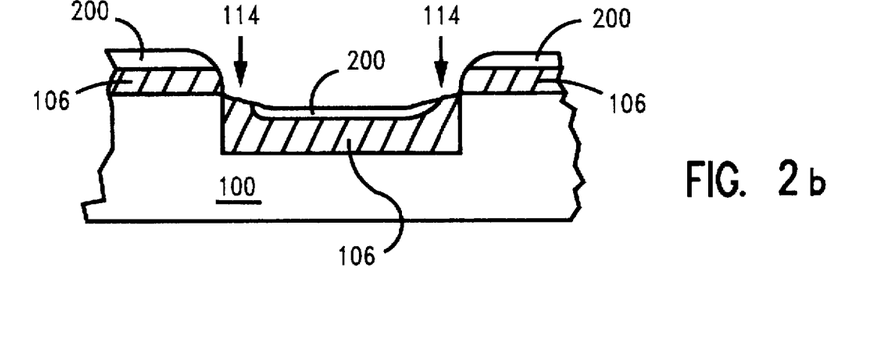

Here, as illustrated in FIG. 2b, it is presently theorized that in corner region 112, incoming ions will encounter a wide range of angles. With less polymer forming at the high angles on corner 112, etching is accelerated. With horizontal portions 108 protected by thicker polymer, etching then propagates downwards along vertical portion 110 until vertical portion 110 is removed. It is further theorized that etching of vertical portion 110 occurs after the initial corner 112 has been distorted because an angle 114 is maintained on vertical portion 110 as etching proceeds.

Figure 2C:
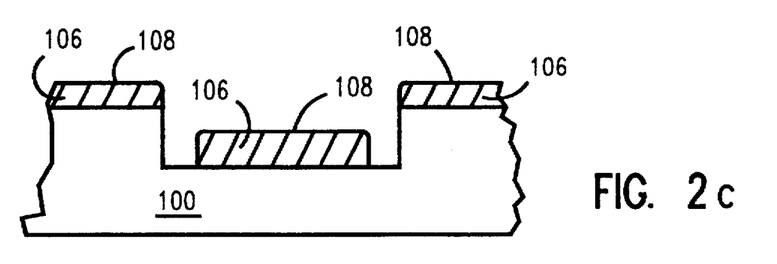
FIG. 2c is a schematic sectional view of the post-etch structure.

The post-etch structure is shown in FIG. 2c. Carbon polymer 200 remaining after etching is complete is removed by a suitable cleaning process such as an oxygen or fluorine rich plasma, wet clean, or organic stripping technique (not shown).

Film 106 may be any material that yields the desired polymerization effect in the described process. Examples include oxynitride films, polysilicon films, silicon nitride films, and the like.

The invention will be described in more detail with reference to the following examples:

EXAMPLE 1

Figure 3A:
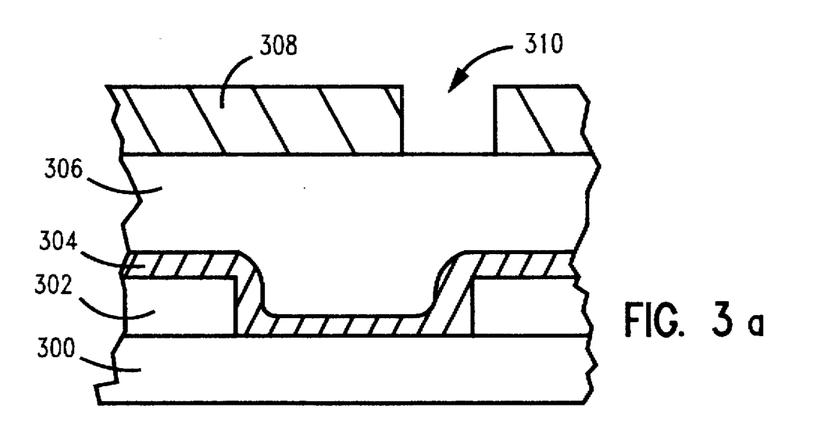
FIG. 3a is a schematic sectional view of a borderless contact structure to be etched in Example 1.

FIG. 3a shows a schematic sectional view of a pre-etch sample patterned in a conventional contact pattern that was processed in accordance with the present invention. The sample has 3000 Å thick oxide structures 302 having substantially horizontal and vertical surfaces on a substrate 300. A 1000 Å thick conformal film 304 of nitride formed by an LPCVD (low pressure chemical vapor deposition) process overlays oxide structures 302 and substrate 300. An approximately 7000 Å thick layer 306 of oxide formed by a PECVD (plasma enhanced chemical vapor deposition) is next, followed by a resist layer 308 with an opening 310 over both a vertical and horizontal portion of conformal layer 304.

The sample was then processed in an early configuration of an Applied Materials 5300 HDP oxide etching system under the following conditions:

| | |
|---|---|
| Ar flow rate | 75 sccm |
| $CF_4$ flow rate | 45 sccm |
| $SiF_4$ flow rate | 20 sccm |
| RF source power | 2250 W |
| RF bias power | 400 W |
| Roof power | 400 W |
| Cathode chiller | −30° C. |
| Chamber walls | 70° C. |

In addition, silicon was sprayed on the aluminum top plate.

Figure 3B:
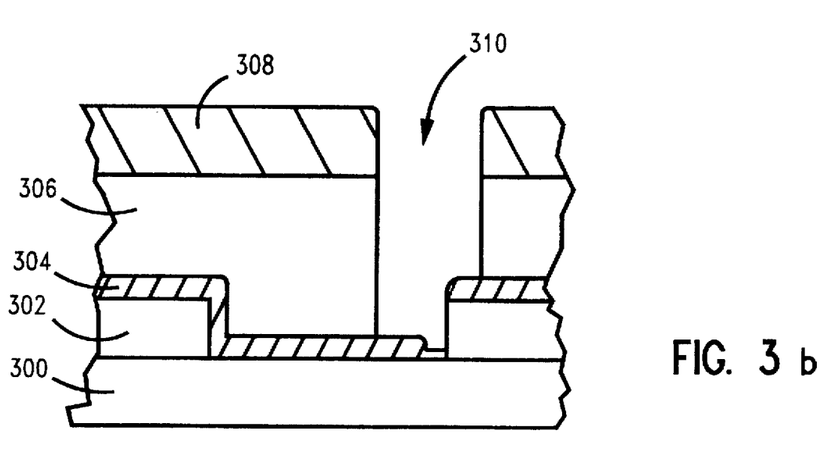

FIG. 3b is a schematic sectional view representing an SEM (scanning electron microscope) of the post-etch sample. Note that the vertical portion (sidewall) of nitride layer 304 has been almost completely removed, while the horizontal surfaces have not been etched at all. During experimentation, the post-etch profile shown in FIG. 3b was repeated across the wafer.

EXAMPLE 2

A borderless contact structure was etched in a later version Applied Materials 5300 HDP oxide etch system under the following conditions:

| | |
|---|---|
| $C_2F_6$ flow rate | 60 sccm |
| RF source power | 2750 W |
| RF bias power | 400 W |
| Chiller | approx. −10 to 10 C. |
| Chamber walls | approx. 200 C. |

Figure 4:
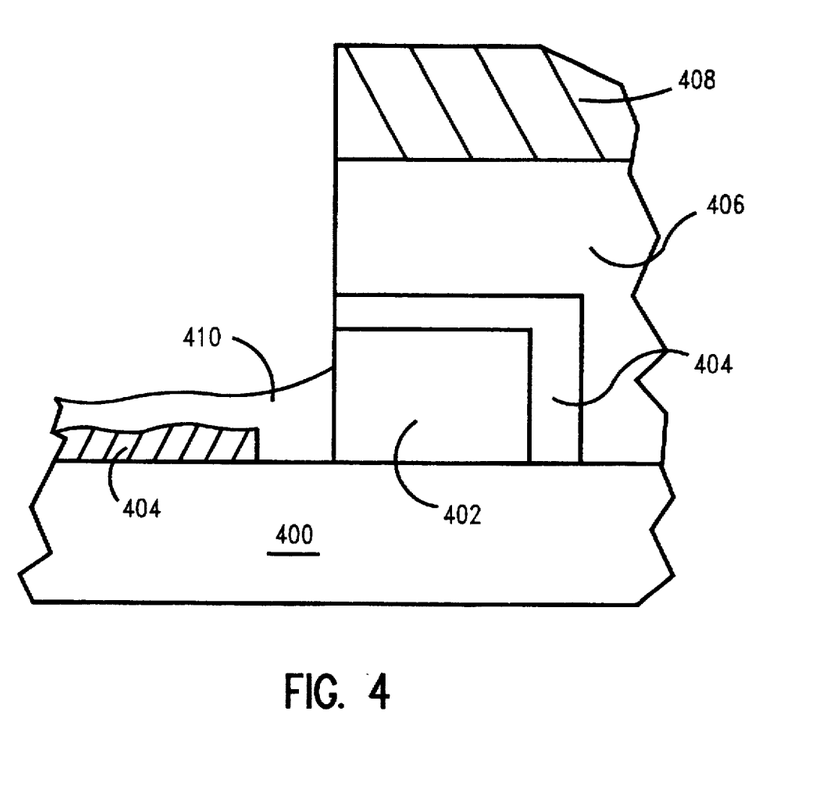
FIG. 4 is a schematic sectional representation of an SEM of the post-etch borderless contact structure of Example 2.

FIG. 4 is a schematic sectional view of an SEM from the contact hole from this example. Shown is a substrate 400 with a polysilicon gate 402 and a conformal silicon nitride layer 404 formed thereon. A layer of PSG (phospho-silicate glass) 406 was formed over layer 404, followed by resist 408 positioned over gate 402. During etching, the vertical portion of layer 404 was almost completely etched away, and polymer 410 formed to protect the exposed horizontal portion of layer 404.

Further experimentation showed in this example that when the $C_2F_6$ gas flow was decreased from 60 to 30 sccm with a similar sample, excess polymer deposition occurred throughout the contact hole, preventing the desired etching from occurring. (Not shown.)

EXAMPLE 3

A borderless contact structure sample similar to that in Example 2 was then etched in the same system under the following conditions:

| | |
|---|---|
| $C_2F_6$ flow rate | 45 sccm |
| RF source power | 2375 W |
| RF bias power | 500 W |
| Cathode Chiller | approx. −10 to 10 C. |
| Chamber walls | approx. 200 C. |

Figure 5:
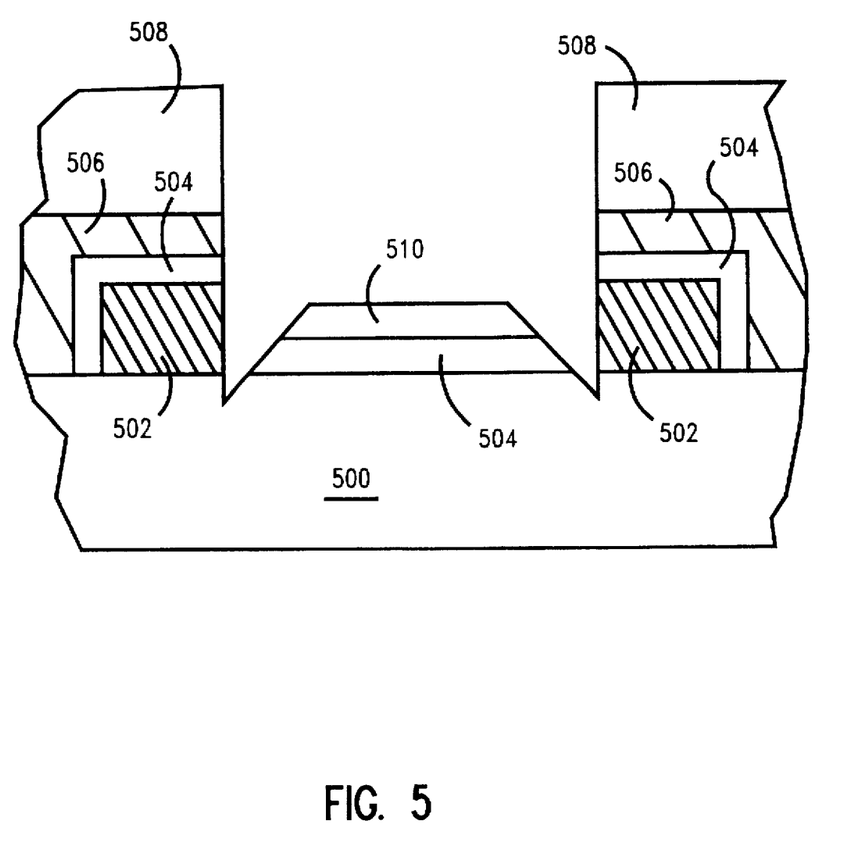
FIG. 5 is a schematic sectional representation of an SEM of the post-etch borderless contact structure of Example 3.

FIG. 5 is a schematic sectional view of an SEM from the contact hole from this example. Shown is a substrate 500 with a polysilicon gate 502 and a conformal silicon nitride layer 504 formed thereon. A layer of PSG (phospho-silicate glass) 506 was formed over layer 504, followed by resist 508 positioned over gate 502. During etching, the vertical portion of layer 504 was completely removed and in fact some overetching occurred as part of substrate 500 was removed.

Most of the exposed horizontal portion of layer 504 is intact and covered with polymer 510, with some of layer 504 missing in the corners. The results from this example demonstrate that with further optimization of the process conditions, $C_2F_6$ would be a suitable etching gas.

From the above examples, generally one wants to operate the etching system in such a way to maximize polymer deposition on horizontal surfaces while minimizing polymer formation on the angled or vertical surfaces to achieve a "sidewall etch" or "spacer etch". The corner sputtering in the instance should also be maximized. This can be accomplished in several ways, such as:

(1) Forming a carbon-rich polymer which does not adhere to the sidewall, by using a chemistry such as $CF_4+SiF_4$, $C_2F_6$ etc.;

(2) Minimizing the addition of hydrogen to the polymer by the plasma chemistry or other sources by avoiding addition of large amounts of $H_2$, $CHF_3$, etc.;

(3) Balancing the ion flux with polymer flux by adjusting appropriate process variables such that polymer favors the horizontal surfaces over the corner regions; and (4) Using an independent bias control such that ion bombardment can be increased independent of polymer precursor formation in the plasma.

USES FOR THE INVENTION

One use for the sidewall etch process is to produce sub-minimum lithographic dimension structures. The current feature size limitation in state-of-the-art lithographic processing is 0.25 microns. In order to define a feature with lateral dimensions below the 0.25 minimum, a deposited film can be used as a mask with the dimension of the opening equal to the width of the sidewall spacer. For example, in FIG. 3b, a line was formed at the bottom of the contact hole approximately 550 Å wide, or 0.055 microns.

Alternately, the deposited film can be a doped material to serve, for example, as a source for an outdiffused junction, while the opening left by the removal of the vertical portion can be used for a lightly doped drain implant.

Figure 6A:
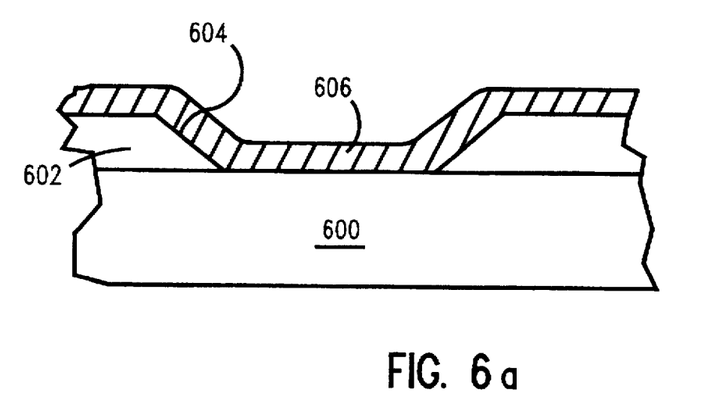
FIGS. 6a and 6b are schematic sectional views of an angled etch implementation for the etching process, all in accordance with the present invention.
Figure 6B:
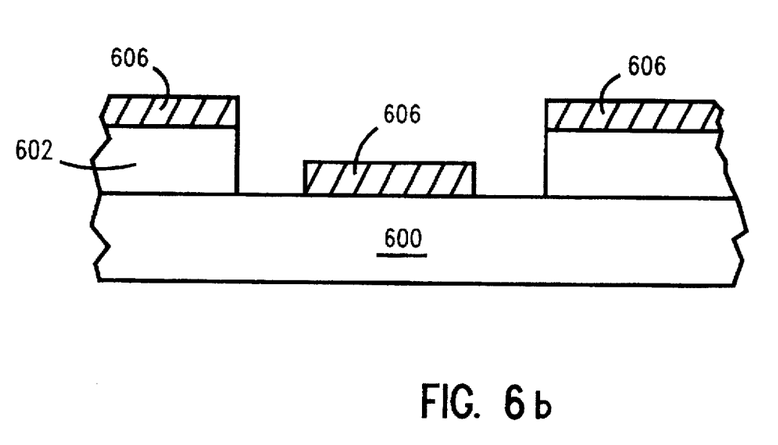

A sub-minimum lithographic dimension structure can also be produced using an angled etch, as shown in FIGS. 6a and 6b. FIG. 6 shows a substrate 600 with a layer 602 formed thereon having an angled surface 604. Layer 602 is formed from a material that will be etched in the sidewall etch process, such as silicon or silicon oxide and similar materials. Surface 604 has an angle such that the polymer will not provide protection during etching. A film 606 is formed over substrate 600 and layer 602. FIG. 6b shows that layer 602 (along with film 606) will be removed, leaving an opening proportional to the arcsin of the angle of surface 604. The angle can easily be tailored to achieve a sub-micron opening, which can be used as described previously.

Note also that stand-alone sidewalls can be etched using this technique as well, i.e. the starting point is not required to be film (conformal or otherwise) of one material. As long as the material on the horizontal surfaces will produce the protective polymer during etching, a sidewall which is susceptible to the etch can be selectively removed. One example for etching a standalone sidewall is in a buried strap process in which contact is made to a deep trench. After the trench is formed in a substrate, a sidewall is then formed in the perimeter of the trench. The center of the trench is then filled with a material which is recessed with respect to the sidewall, so that the sidewall acts as a collar. The sidewall can be etched back to (or slightly below) the level of the fill using the selective etch, if the substrate surface and the fill will form a protective polymer during the etching.

In summary, a means has been provided for selectively etching a substantially vertical portion of a film, without attacking substantially horizontal portions of the same film or adjacent structures, which can be used to make structures with sub-micron lateral dimensions equal to the thickness of the vertical portion of the film.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for etching a film on a body, comprising the steps of:
   providing a body with a substantially horizontal surface and a substantially vertical surface, the body having a film formed thereupon, the film having a substantially horizontal portion on the substantially horizontal surface, a substantially vertical portion on the substantially vertical surface; and
   etching the substantially vertical portion of the film while leaving the body and the substantially horizontal portion of the film substantially intact.

2. The method of claim 1 wherein the body is a semiconductor substrate.

3. The method of claim 1 wherein the film is conformal.

4. The method of claim 1 wherein the etching step is performed using a high density plasma process.

5. The method of claim 4 wherein the high density plasma process uses an etching gas comprised mainly of a fluorocarbon compound $C_xF_y$, where x and y are greater than zero.

6. The method of claim 5 wherein the fluorocarbon compound is $C_2F_6$.

7. The method of claim 5 wherein the fluorocarbon compound is $CF_4$.

8. The method of claim 7 wherein the etching gas also includes $SiF_4$.

9. The method of claim 1 wherein the film comprises a material which promotes formation of a protective layer on the substantially horizontal portions during the removing step.

10. The method of claim 9 wherein the protective layer is a carbonaceous polymer.

11. The method of claim 9 wherein the film is a nitride.

12. The method of claim 11 wherein the film is silicon nitride.

13. The method of claim 11 wherein the film is an oxynitride.

14. A method for selectively removing a sidewall, comprising the steps of:
   providing a body with a substantially horizontal surface and a substantially vertical surface, the sidewall formed on the substantially vertical surface;
   etching the sidewall while leaving the body substantially intact.

15. The method of claim 14 wherein the body is a semiconductor substrate.

16. The method of claim 14 wherein the sidewall is etched using a high density plasma process.

17. The method of claim 16 wherein the high density plasma process uses an etching gas comprised mainly of a fluorocarbon compound $C_xF_y$ where x and y are greater than zero.

18. The method of claim 17 wherein the fluorocarbon compound is $C_2F_6$.

19. The method of claim 17 wherein the fluorocarbon compound is $CF_4$.

20. The method of claim 18 wherein the etching gas also includes $SiF_4$.

21. The method of claim 14 wherein the body comprises a material which promotes formation of a protective layer on the body during the removing step.

22. The method of claim 21 wherein the protective layer is a carbonaceous polymer.

23. A method of making a structure with sub-micron lateral dimensions, the method comprising the steps of:
   providing a substrate having a substantially vertical surface and a substantially horizontal surface;
   forming a film on the substrate, the film having a substantially horizontal portion on the substantially horizontal surface, a substantially vertical portion on the substantially vertical surface;
   etching the substantially vertical portion of the film while leaving the substrate and the substantially horizontal portion of the film substantially intact;
   using the vertical surface and the substantially horizontal portion together as a mask with an opening having a dimension in the sub-micron range to create the structure with sub-micron lateral dimensions.

24. The method of claim 23 wherein the film is conformal.

25. The method of claim 23 wherein the removing step is performed using a high density plasma process.

26. The method of claim 25 wherein the high density plasma process uses an etching gas comprised mainly of a fluorocarbon compound $C_xF_y$ where x and y are greater than zero.

27. The method of claim 26 wherein the fluorocarbon compound is $C_2F_6$.

28. The method of claim 26 wherein the fluorocarbon compound is $CF_4$.

29. The method of claim 7 wherein the etching gas also includes $SiF_4$.

30. The method of claim 23 wherein the film comprises a material which promotes formation of a protective layer on the substantially horizontal portion during the removing step.

31. The method of claim 30 wherein the protective layer is a carbonaceous polymer.

32. The method of claim 30 wherein the film is a nitride.

33. The method of claim 32 wherein the film is silicon nitride.

34. The method of claim 32 wherein the film is an oxynitride.

* * * * *